United States Patent
Ishii et al.

(10) Patent No.: US 8,164,002 B2
(45) Date of Patent: Apr. 24, 2012

(54) WIRED CIRCUIT BOARD AND PRODUCING METHOD THEREOF

(75) Inventors: Jun Ishii, Osaka (JP); Yasunari Ooyabu, Osaka (JP)

(73) Assignee: NITTO DENKO Corporation, Osaka (JP)

( * ) Notice: Subject to any disclaimer, the term of this patent is extended or adjusted under 35 U.S.C. 154(b) by 999 days.

(21) Appl. No.: 12/004,038

(22) Filed: Dec. 20, 2007

(65) Prior Publication Data

US 2008/0149375 A1    Jun. 26, 2008

Related U.S. Application Data

(60) Provisional application No. 60/907,023, filed on Mar. 16, 2007.

(30) Foreign Application Priority Data

Dec. 25, 2006  (JP) .................................. 2006-347867

(51) Int. Cl.
*H05K 1/03* (2006.01)
(52) U.S. Cl. ....................................................... 174/255
(58) Field of Classification Search .................. 174/255, 174/250, 254, 260, 261; 360/245.9
See application file for complete search history.

(56) References Cited

U.S. PATENT DOCUMENTS

| 2002/0097531 A1 | 7/2002 | Inoue et al. |
| 2003/0089520 A1 | 5/2003 | Ooyabu et al. |
| 2003/0151902 A1 | 8/2003 | Kageyama et al. |
| 2005/0062020 A1 | 3/2005 | Abe |
| 2006/0187587 A1* | 8/2006 | Arai et al. ................. 360/245.9 |
| 2006/0269730 A1 | 11/2006 | Ishii et al. |

FOREIGN PATENT DOCUMENTS

| JP | 5-331431 | 12/1993 |
| JP | 9-207259 | 8/1997 |
| JP | 2002-163808 | 6/2002 |
| JP | 2002-275261 | 9/2002 |
| JP | 2003-124581 | 4/2003 |
| JP | 2003-152383 | 5/2003 |
| JP | 2003-203436 | 7/2003 |
| JP | 2003-204130 | 7/2003 |
| JP | 2004-35825 | 2/2004 |
| JP | 2004-158480 | 6/2004 |
| JP | 2006-134421 | 5/2006 |
| JP | 2006-332548 | 12/2006 |
| JP | 2006-332549 | 12/2006 |

* cited by examiner

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A wired circuit board includes a metal supporting board, an insulating base layer formed on the metal supporting board, a conductive pattern formed on the insulating base layer, a first semiconductive layer formed on a surface of the insulating base layer exposed from the conductive pattern, an insulating cover layer formed on the conductive pattern and the first semiconductive layer and a second semiconductive layer formed on a surface of the insulating cover layer. The first semiconductive layer is electrically connected to the conductive pattern and the metal supporting board, and the second semiconductive layer is electrically connected to the metal supporting board.

8 Claims, 4 Drawing Sheets

FIG. 5
(e)
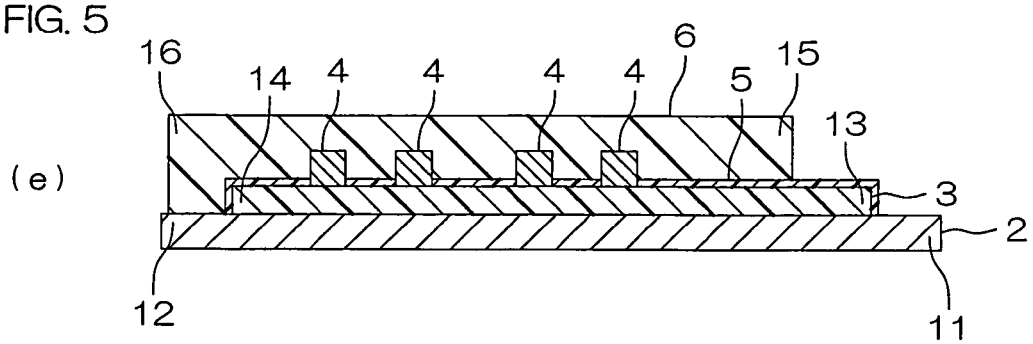
(f)
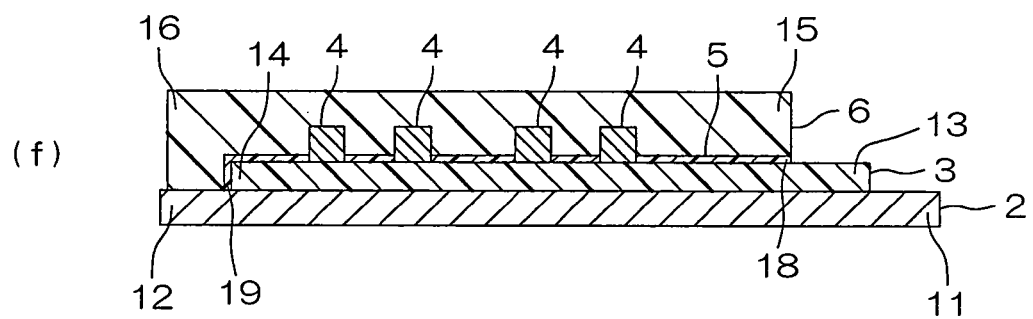
(g)
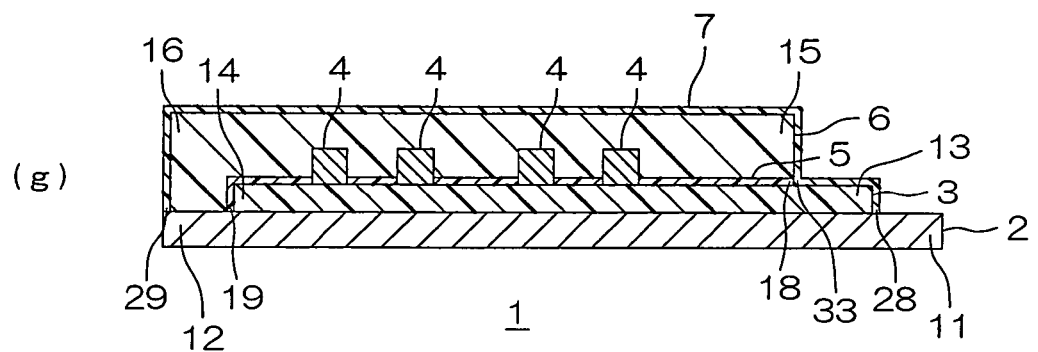

WIRED CIRCUIT BOARD AND PRODUCING METHOD THEREOF

CROSS-REFERENCE TO RELATED APPLICATION

This patent application claims the benefit of U.S. Provisional Application No. 60/907,023 filed on Mar. 16, 2007, and claims priority from Japanese Patent Application No. 2006-347867 filed on Dec. 25, 2006, the contents of which are herein incorporated by reference in their entirety.

BACKGROUND OF THE INVENTION

1. Field of the Invention

The present invention relates to a wired circuit board and a producing method thereof. More particularly, the present invention relates to a wired circuit board such as a flexible wired circuit board or a suspension board with circuit, and a producing method thereof.

2. Description of the Related Art

A wired circuit board such as a flexible wired circuit board or a suspension board with circuit includes, for example, an insulating base layer of polyimide resin or the like, a conductive layer of copper foil or the like, which is formed on the insulating base layer, and an insulating cover layer of polyimide resin or the like, which covers the conductive layer on the insulating base layer. The wired circuit boards of this type are widely used in a variety of fields of electric and electronic equipment.

In such wired circuit board, in order to prevent electronic components mounted thereon from electrostatic breakdown, there has been proposed that a conductive polymer layer is formed on the cover layer to remove static electricity charged via the conductive polymer layer (cf., Japanese Unexamined Patent Publication No. 2004-158480).

SUMMARY OF THE INVENTION

However, the conductive polymer layer formed on the cover layer, which has been described in Japanese Unexamined Patent Publication No. 2004-158480, is insufficient alone for removing the static electricity. Therefore, the electrostatic breakdown of the electronic components mounted may not be reliably prevented.

It is an object of the present invention to provide a wired circuit board capable of efficiently removing static electricity and of reliably preventing electrostatic breakdown of electronic components mounted thereon, and a producing method thereof.

To achieve the foregoing objects, the wired circuit board of the present invention includes a metal supporting board, an insulating base layer formed on the metal supporting board, a conductive pattern formed on the insulating base layer, a first semiconductive layer formed on a surface of the insulating base layer exposed from the conductive pattern, an insulating cover layer formed on the conductive pattern and the first semiconductive layer, and a second semiconductive layer formed on a surface of the insulating cover layer, wherein the first semiconductive layer is electrically connected to the conductive pattern and the metal supporting board, and the second semiconductive layer is electrically connected to the metal supporting board.

In the wired circuit board of the present invention, it is preferable that both the first semiconductive layer and the second semiconductive layer are made of a conductive polymer.

In the wired circuit board of the present invention, it is preferable that the conductive pattern includes a terminal portion exposed by opening the insulating cover layer, and at least one end of the second semiconductive layer is electrically connected to the terminal portion, and at least the other end of the second semiconductive layer is electrically connected to the metal supporting board.

In the wired circuit board of the present invention, it is preferable that the first semiconductive layer and the second semiconductive layer are in contact with each other.

In the wired circuit board of the present invention, it is preferable that the first semiconductive layer has a surface resistance value of $10^4$ to $10^{12} \Omega/\square$.

In the wired circuit board of the present invention, it is preferable that the second semiconductive layer has a surface resistance value of $10^4$ to $10^{12} \Omega/\square$.

The method for producing a wired circuit board according to the present invention includes the steps of preparing a metal supporting board and forming an insulating base layer formed on the metal supporting board and a conductive pattern formed on the insulating base layer, forming a first semiconductive layer on a surface of the insulating base layer exposed from the conductive pattern so as to be electrically connected to the conductive pattern and the metal supporting board, forming an insulating cover layer on the conductive pattern and the first semiconductive layer, and forming a second semiconductive layer on a surface of the insulating cover layer so as to be electrically connected to the metal supporting board.

In the method for producing a wired circuit board according to the present invention, it is preferable that the first semiconductive layer is formed from a conductive polymer in the step of forming the first semiconductive layer, and the second semiconductive layer is formed from a conductive polymer in the step of forming the second semiconductive layer.

The wired circuit board of the present invention includes a first semiconductive layer formed on a surface of the insulating base layer, and a second semiconductive layer formed on a surface of the insulating cover layer, wherein the first semiconductive layer is electrically connected to the conductive pattern and the metal supporting board, and the second semiconductive layer is electrically connected to the metal supporting board. Therefore, the first semiconductive layer and the second semiconductive layer allow to efficiently remove the static electricity charged on the conductive pattern, the insulating base layer, and the insulating cover layer, thereby allowing to reliably prevent electrostatic breakdown of the electronic components mounted thereon.

Further, the method for producing the wired circuit board of the present invention includes the steps of forming the first semiconductive layer on a surface of the insulating base layer exposed from the conductive pattern so as to be electrically connected to the conductive pattern and the metal supporting board, and forming the second semiconductive layer on a surface of the insulating cover layer so as to be electrically connected to the metal supporting board. Thus, in the wired circuit board obtained by this producing method, the first semiconductive layer and the second semiconductive layer allow to efficiently remove the static electricity charged on the conductive pattern, the insulating base layer, and the insulating cover layer, thereby allowing to reliably prevent electrostatic breakdown of the electronic components mounted thereon.

BRIEF DESCRIPTION OF THE DRAWINGS

FIG. 5 is a sectional view illustrating the steps of producing the suspension board with circuit shown in FIG. 1 in the widthwise direction thereof, subsequent to FIG. 4, (e) showing the step of forming an insulating cover layer on the metal supporting board, the conductive pattern, and the first semiconductive layer, (f) showing the step of removing the first semiconductive layer exposed from the insulating cover layer by etching, and (g) showing the step of forming a second semiconductive layer on a surface of the insulating cover layer.

DETAILED DESCRIPTION OF PREFERRED EMBODIMENTS

Figure 1:
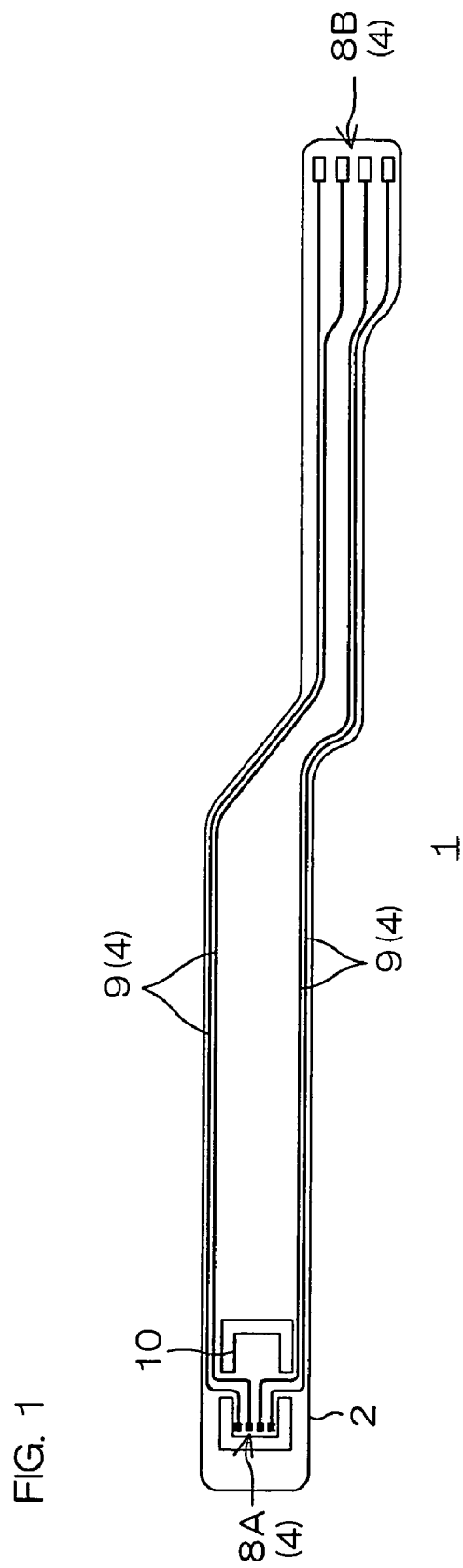
FIG. 1 is a schematic plan view illustrating a suspension board with circuit as an embodiment of a wired circuit board according to the present invention.
Figure 2:
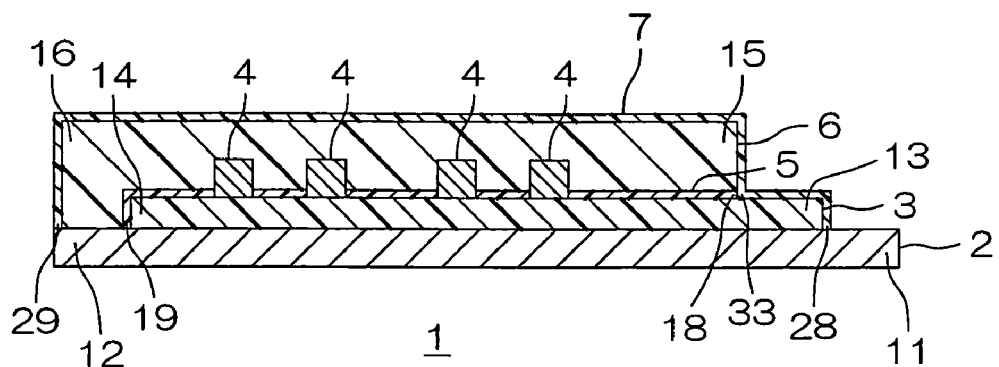
FIG. 2 is a sectional view of the suspension board with circuit shown in FIG. 1 in a widthwise direction thereof.
Figure 3:
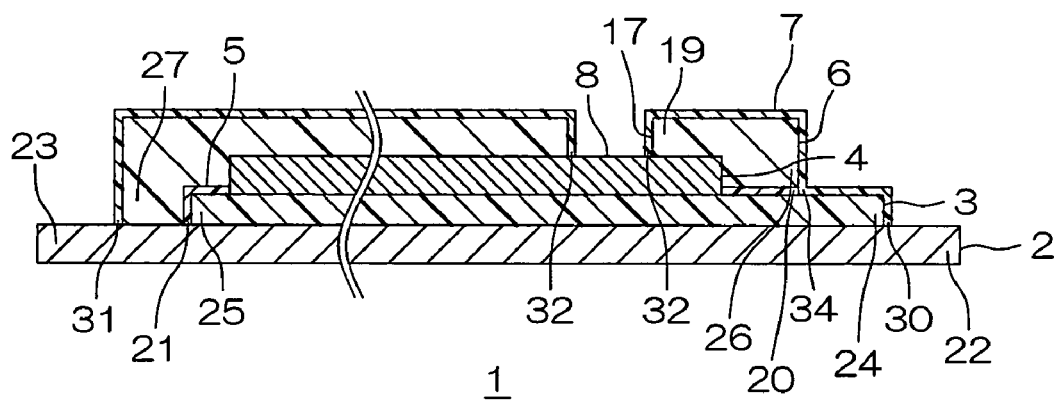
FIG. 3 is a fragmentary sectional view of the suspension board with circuit shown in FIG. 1 in a lengthwise direction thereof.

FIG. 1 is a schematic plan view illustrating a suspension board with circuit as an embodiment of a wired circuit board according to the present invention, FIG. 2 is a sectional view of the suspension board with circuit shown in FIG. 1 in a widthwise direction thereof, and FIG. 3 is a fragmentary sectional view of the suspension board with circuit shown in FIG. 1 in a lengthwise direction thereof. To clarify a relative arrangement of a conductive pattern 4 to a metal supporting board 2, an insulating base layer 3, a first semiconductive layer 5, an insulating cover layer 6, and a second semiconductive layer 7, which are described later, are omitted in FIG. 1.

In FIG. 1, a suspension board with circuit 1 is mounted on a hard disk drive. In the suspension board with circuit 1, the conductive pattern 4 for connecting a magnetic head (not shown) and an (external) read/write board is formed integrally on the metal supporting board 2. The metal supporting board 2 supports the magnetic head mounted thereon, while holding a minute gap between the magnetic head and a magnetic disk against an airflow caused when the magnetic head and the magnetic disk travel relatively to each other.

The conductive pattern 4 includes magnetic-head-side connecting terminal portions 8A, external connecting terminal portions 8B, and wires 9 for connecting therebetween, which are formed integrally and continuously.

The plurality of wires 9 are provided along a lengthwise direction of the metal supporting board 2 and are arranged in parallel at spaced intervals in a widthwise direction (a direction orthogonal to the lengthwise direction; the same applies hereinafter) thereof.

The plurality of magnetic-head-side connecting terminal portions 8A are arranged at a front end portion of the metal supporting board 2 in parallel as a broad land to individually connect with front end portions of the wires 9. Terminal portions (not shown) of the magnetic head are connected to the magnetic-head-side connecting terminal portions 8A.

The plurality of external connecting terminal portions 8B are arranged at a rear end portion of the metal supporting board 2 in parallel as a broad land to individually connect with rear end portions of the wires 9. Terminal portions (not shown) of the read/write board are connected to the external connecting terminal portion 8B.

A gimbal 10 for mounting the magnetic head is provided in the front end portion of the metal supporting board 2. The gimbal 10 is formed by cutting out the metal supporting board 2 so as to sandwich the magnetic-head-side connecting terminal portions 8A in the lengthwise direction.

The suspension board with circuit 1 includes the metal supporting board 2, the insulating base layer 3 formed on the metal supporting board 2, and the conductive pattern 4 formed on the insulating base layer 3 as shown in FIGS. 2 and 3. Further, the suspension board with circuit 1 includes the first semiconductive layer 5 formed on a surface of the insulating base layer 3 exposed from the conductive pattern 4, the insulating cover layer 6 formed on the conductive pattern 4 and the first semiconductive layer 5, and the second semiconductive layer 7 formed on a surface of the insulating cover layer 6.

The metal supporting board 2 is formed from a flat thin plate extending in the lengthwise direction corresponding to the outer shape of the suspension board with circuit 1 described above.

The length (length in lengthwise direction) and width (length in widthwise direction) of the metal supporting board 2 are appropriately selected depending on the purpose and application.

The insulating base layer 3 is formed on the metal supporting board 2 as a pattern corresponding to a portion where the conductive pattern 4 is formed. More specifically, the insulating base layer 3 is formed in the middle of the widthwise direction of the metal supporting board 2 so that a widthwise one end portion 11 and a widthwise other end portion 12 of the metal supporting board 2 are exposed. Further, the insulating base layer 3 is formed in the middle of the lengthwise direction of the metal supporting board 2 so that a lengthwise one end portion 22 and a lengthwise other end portion 23 of the metal supporting board 2 are exposed.

The length and width of the insulating base layer 3 are appropriately selected depending on the purpose and application to provide the above-mentioned shape.

The conductive pattern 4 is formed on the insulating base layer 3 so as to be exposed from the first semiconductive layer 5. Further, as described above and shown in FIG. 1, the conductive pattern 4 is formed as a wired circuit pattern which integrally includes the plurality of wires 9 arranged in parallel at spaced intervals to one another, the magnetic-head-side connecting terminal portions 8A and the external connecting terminal portions 8B connected to the front end portions and the rear end portions of the wires 9, respectively. The magnetic-head-side connecting terminal portions 8A and the external connecting terminal portions 8B are hereinafter simply described as "the terminal portion 8", when no particular distinction is required.

Each of the wires 9 has a width in the range of, for example, 10 to 100 μm, or preferably 15 to 50 μm, and a spacing between each of the wires 9 is in the range of, for example, 10 to 100 μm, or preferably 15 to 50 μm.

Each of the terminal portions 8 has a width in the range of, for example, 50 to 1000 μm, or preferably 80 to 500 μm, and a spacing between each of the terminal portions 8 is in the range of, for example, 50 to 1000 μm, or preferably 80 to 500 μm.

The first semiconductive layer 5 is formed so as to cover the insulating base layer 3 exposed from the conductive pattern 4. More specifically, the first semiconductive layer 5 is formed on the surface of the insulating base layer 3 both exposed from the conductive pattern 4 and covered with the insulating cover layer 6. That is, the first semiconductive layer 5 is formed so as to be interposed between the insulating base layer 3 and the insulating cover layer 6.

As shown in FIG. 2, the first semiconductive layer 5 is formed so that a widthwise one end portion 13 of the insulating base layer 3 and the widthwise other end portion 12 of the metal supporting board 2 are exposed in the widthwise direction. Further, as shown in FIG. 3, the first semiconductive layer 5 is formed so that a lengthwise one end portion 24 of the insulating base layer 3 and the lengthwise other end portion 23 of the metal supporting board 2 are exposed in the lengthwise direction.

More specifically, as shown in FIGS. 2 and 3, the first semiconductive layer 5 is continuously formed on lateral side surfaces (portions adjacent to the conductive pattern 4 in the widthwise and the lengthwise directions while exposing the conductive pattern 4) of the conductive pattern 4, and upper surfaces (except upper surfaces of the widthwise one end portion 13 and the lengthwise one end portion 24 of the insulating base layer 3) and lateral side surfaces (except lateral side surfaces of the widthwise one end portion 13 and the lengthwise one end portion 24 of the insulating base layer 3) of the insulating base layer 3 exposed from the conductive pattern 4 in the widthwise and the lengthwise directions. Further, the first semiconductive layer 5 is formed on an upper surface of the metal supporting board 2 exposed from the insulating base layer 3. More specifically, a portion formed on a lateral side surface of the widthwise other end portion 14 of the insulating base layer 3 and laminated on an upper surface of the widthwise other end portion 12 of the metal supporting board 2 is defined as a first lower end portion 19, and a portion formed on a lateral side surface of the lengthwise other end portion 25 of the insulating base layer 3 and laminated on an upper surface of the lengthwise other end portion 23 of the metal supporting board 2 is defined as a second lower end portion 21.

Therefore, the first semiconductive layer 5 is in contact with the insulating base layer 3 on the lower side in the thickness direction, and in contact with the insulating cover layer 6 on the upper side in the thickness direction. Further, the first semiconductive layer 5 is in contact with and electrically connected to the conductive pattern 4 in the widthwise and the lengthwise directions, and the first lower end portion 19 and the second lower end portion 21 is in contact with and electrically connected to the metal supporting board 2 on the lower side in the thickness direction.

The insulating cover layer 6 is formed on the metal supporting board 2, the conductive pattern 4, and the first semiconductive layer 5. More specifically, the insulating cover layer 6 is formed so that a widthwise one end portion 15 and a lengthwise one end portion 26 are in the same position in plane view as a widthwise one end portion 18 and a lengthwise one end portion 20 of the first semiconductive layer 5 on widthwise one side and lengthwise one side, respectively. Further, the insulating cover layer 6 is formed so that the other end edge of the widthwise other end portion 12 and the lengthwise other end portion 23 of the metal supporting board 2 are exposed in plane view on the widthwise other sides and the lengthwise other sides, respectively.

That is, the insulating cover layer 6 is continuously formed along the widthwise and the lengthwise directions on an upper surface and lateral side surfaces (except portions in contact with the first semiconductive layer 5 in the widthwise and the lengthwise directions) of the conductive pattern 4, and an upper surface and lateral side surfaces (a lateral side surface of the first semiconductive layer 5 formed on the lateral side surface of the widthwise other end portion 14 of the insulating base layer 3, and a lateral side surface of the first semiconductive layer 5 formed on the lateral side surface of the lengthwise other end portion 25 of the insulating base layer 3) of the first semiconductive layer 5. Further, the insulating cover layer 6 is continuously formed along the widthwise and the lengthwise directions on an upper surface (except the upper surface of the other end edge of the widthwise other end portion 12) of the widthwise other end portion 12 of the metal supporting board 2 exposed from the first lower end portion 19 of the first semiconductive layer 5, and an upper surface of the lengthwise other end portion 23 of the metal supporting board 2 exposed from the second lower end portion 21 of the first semiconductive layer 5.

As shown in FIG. 3, the insulating cover layer 6 is formed with an opening 17 by opening at a position corresponding to the terminal portion 8 in plane view, so that the terminal portion 8 is exposed from the opening 17.

The length and width of the insulating cover layer 6 are appropriately selected depending on the purpose and application to provide the above-mentioned shape.

As shown in FIGS. 2 and 3, the second semiconductive layer 7 is formed on the surface of the insulating cover layer 6 and the surface of the insulating base layer 3 exposed from the insulating cover layer 6. That is, as shown in FIG. 2, the second semiconductive layer 7 is formed in the widthwise direction so that the widthwise one end portion 11 of the metal supporting board 2 is exposed and so as to cover the other end edge of the widthwise other end portion 12 of the metal supporting board 2. Further, as shown in FIG. 3, the second semiconductive layer 7 is formed in the lengthwise direction so that both the lengthwise one end portion 22 and the lengthwise other end portion 23 of the metal supporting board 2 are exposed.

More specifically, the second semiconductive layer 7 is continuously formed along with the widthwise and the lengthwise directions on an upper surface and lateral side surfaces (a lateral side surface of the widthwise one end portion 15, a lateral side surface of the widthwise other end portion 16, a lateral side surface of the lengthwise one end portion 26, and a lateral side surface of a lengthwise other end portion 27) of the insulating cover layer 6, an upper surface and a lateral side surface of the widthwise one end portion 13 of the insulating base layer 3 exposed from the first semiconductive layer 5, and an upper surface and a lateral side surface of the lengthwise one end portion 24 of the insulating base layer 3 exposed from the first semiconductive layer 5.

The second semiconductive layer 7 is formed so as to expose the terminal portion 8. More specifically, the second semiconductive layer 7 is formed on an inner side surface of the insulating cover layer 6 at the opening 17 of the terminal portion 8, and a lower end portion (a seventh lower end portion 32 described later) of the second semiconductive layer 7 formed on the inner side surface of the insulating cover layer 6 is laminated on the upper surface of the peripheral end edge of the terminal portion 8.

Thus, as shown in FIG. 2, in the second semiconductive layer 7, a third lower end portion 28 as the other end on the upper surface of the widthwise one end portion 11 of the metal supporting board 2 and a fourth lower end portion 29 as the other end on the upper surface of the widthwise other end portion 12 of the metal supporting board 2 are in contact with and electrically connected to the metal supporting board 2 in the widthwise direction. Further, as shown in FIG. 3, in the second semiconductive layer 7, a fifth lower end portion 30 as the other end on the upper surface of the lengthwise one end portion 22 of the metal supporting board 2 and a sixth lower end portion 31 as the other end on the upper surface of the lengthwise other end portion 23 of the metal supporting board 2 are in contact with and electrically connected to the metal supporting board 2 in the lengthwise direction. Further, in the second semiconductive layer 7, the seventh lower end portion 32 as one end on the upper surface of the peripheral end edge of the terminal portion 8 is in contact with and electrically connected to the terminal portion 8.

Further, as shown in FIG. 2, in the second semiconductive layer 7, a first continuous portion 33 of the second semiconductive layer 7 formed on the upper surface of the widthwise one end portion 13 of the insulating base layer 3 and the second semiconductive layer 7 formed on the lateral side surface of the widthwise one end portion 15 of the insulating cover layer 6 is in contact with and electrically connected to the widthwise one end portion 18 of the first semiconductive layer 5 in the widthwise direction. As shown in FIG. 3, in the second semiconductive layer 7, a second continuous portion 34 of the second semiconductive layer 7 formed on the upper surface of the lengthwise one end portion 24 of the insulating base layer 3 and the second semiconductive layer 7 formed on the lateral side surface of the lengthwise one end portion 26 of the insulating cover layer 6 is in contact with and electrically connected to the lengthwise one end portion 20 of the first semiconductive layer 5 in the lengthwise direction.

That is, the second semiconductive layer 7 is in contact with the metal supporting board 2, the insulating base layer 3, the terminal portion 8 of the conductive pattern 4, the first semiconductive layer 5, and the insulating cover layer 6. The second semiconductive layer 7 is also electrically connected to the metal supporting board 2 and the terminal portion 8 of the conductive pattern 4.

In the suspension board with circuit 1, a metal plating layer, which is not shown, is formed on the upper surface of the terminal portion 8 (except an upper surface laminated with the seventh lower end portion 32 of the second semiconductive layer 7).

Figure 4:
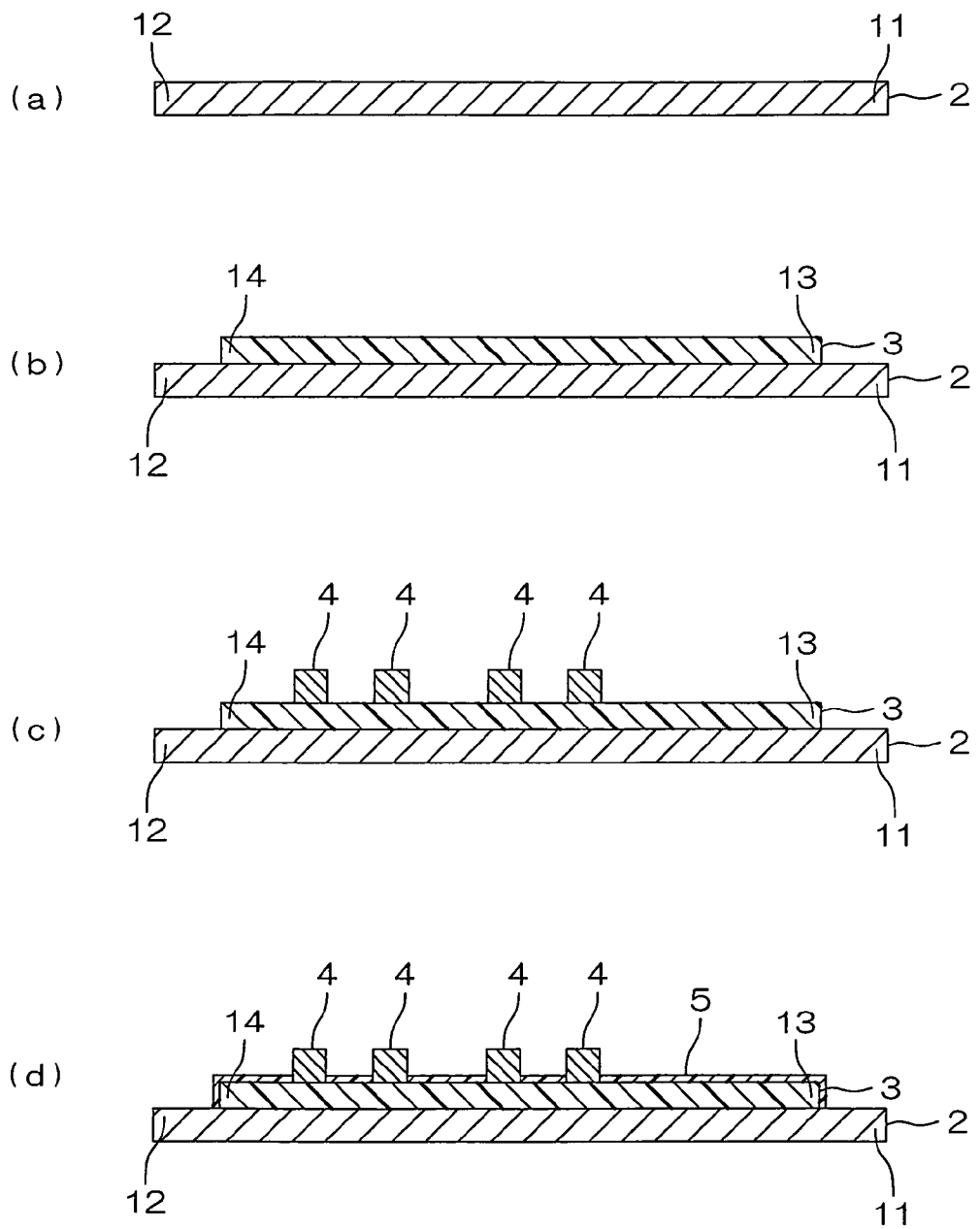
FIG. 4 is a sectional view illustrating the steps of producing the suspension board with circuit shown in FIG. 1 in the widthwise direction thereof, (a) showing the step of preparing a metal supporting board, (b) showing the step of forming an insulating base layer on the metal supporting board, (c) showing the step of forming a conductive pattern on the insulating base layer, and (d) showing the step of forming a first semiconductive layer on a surface of the insulating base layer exposed from the conductive pattern.

FIGS. 4 and 5 are sectional views illustrating the steps of producing the suspension board with circuit shown in FIG. 1 in the widthwise direction thereof.

Next, a method for producing the suspension board with circuit is described with reference to FIGS. 4 and 5.

In this method, the metal supporting board 2 is first prepared, as shown in FIG. 4(a).

A metal foil, such as stainless foil, 42-alloy, aluminum, copper-beryllium, or phosphor bronze, is used for the metal supporting board 2. Preferably, stainless foil is used. The metal supporting board 2 has a thickness in the range of, for example, 10 to 50 μm, or preferably 15 to 30 μm.

Then, in this method, as shown in FIG. 4(b), the insulating base layer 3 is formed on the metal supporting board 2. The insulating base layer 3 is formed as the above-mentioned pattern corresponding to a portion in which the conductive pattern 4 is formed.

The insulating base layer 3 is formed of resin, for example, polyimide resin, polyamide imide resin, acrylic resin, polyether nitrile resin, polyether sulfone resin, polyethylene terephthalate resin, polyethylene naphthalate resin, polyvinyl chloride resin, or the like. Of these resins, polyimide resin is preferably used in terms of heat resistance.

The method for forming the insulating base layer 3 as the above-mentioned pattern is not particularly limited and a known method is used. For example, a varnish of photosensitive resin (photosensitive polyamic acid resin) is coated over the surface of the metal supporting board 2, and the coated varnish is dried to form a base coating. Subsequently, the base coating is exposed to light via a photomask, and then heated as required and developed to form a pattern. Then, for example, the pattern is heated at 250° C. or higher under reduced pressure to be cured (imidized).

The insulating base layer 3 thus formed has a thickness in the range of, for example, 1 to 35 μm, or preferably 8 to 15 μm.

Then, in this method, as shown in FIG. 4(c), the conductive pattern 4 is formed on the insulating base layer 3. The conductive pattern 4 is formed as a wired circuit pattern integrally including the terminal portion 8 and the wire 9 both described above.

The conductive pattern 4 is formed of a conductive material, for example, copper, nickel, gold, solder, or alloys thereof, or preferably copper is used. The conductive pattern 4 is formed on the upper surface of the insulating base layer 3 as the above-mentioned wired circuit pattern by a known patterning method, such as a subtractive method or an additive method, or preferably the additive method.

In the subtractive method, a conductive layer is first laminated on the upper surface of the insulating base layer 3 via an adhesive layer as required. Then, an etching resist having the same pattern as the wired circuit pattern is formed on the conductive layer. Subsequently, the conductive layer is etched using the etching resist as a resist, and thereafter, the etching resist is removed.

On the other hand, in the additive method, a thin conductive film is first formed on the entire surface (the upper surface and the lateral side surfaces) of the insulating base layer 3. To form the thin conductive film, a thin chromium film and a thin copper film are laminated by sputtering method, or preferably chromium sputtering and copper sputtering.

Then, after a plating resist is formed in a pattern reverse to the wired circuit pattern on the upper surface of the thin conductive film, the conductive pattern 4 is formed as the wired circuit pattern on the upper surface of the thin conductive film exposed from the plating resist by electrolytic plating. Thereafter, the plating resist and the thin conductive film on which the plating resist is laminated are removed.

The conductive pattern 4 thus formed has a thickness in the range of, for example, 3 to 20 μm, or preferably 5 to 20 μm.

Then, in this method, as shown in FIG. 4(d), the first semiconductive layer 5 is formed on the surface of the insulating base layer 3 exposed from the conductive pattern 4 so as to be in contact with and electrically connected to the conductive pattern 4 and the metal supporting board 2.

For example, resin or metal is used as a semiconductive material for forming the first semiconductive layer 5.

The resin that may be used includes, for example, a conductive polymer such as semiconductive resin composition in which conductive particles are dispersed.

Of these semiconductive materials for forming the first semiconductive layer 5, a conductive polymer is preferably used.

The conductive polymer that may be used includes, for example, polyaniline, polypyrrole, and polythiophene, or a derivative thereof, or preferably polyaniline is used. These conductive polymers can be used alone or in combination of two or more kinds.

The metal such as metal oxide is used, for example. Examples of the metal oxide include chromium oxide, nickel oxide, copper oxide, titanium oxide, zirconium oxide, indium oxide, aluminum oxide, and zinc oxide, or chromium oxide is preferably used. These metals can be used alone or in combination of two or more kinds.

The first semiconductive layer 5 can be formed from the conductive polymer, for example, by a method of dipping the suspension board with circuit 1 in a polymeric liquid of a conductive polymer to polymerize and deposit the polymer, a method of applying a solution of a conductive polymer to the suspension board with circuit 1 and drying a solvent thereof, or the like.

In the method of dipping the suspension board with circuit 1 in a polymeric liquid of a conductive polymer to polymerize and deposit the polymer, for example, the suspension board with circuit 1 in a production process shown in FIG. 4(*c*) is first dipped in a polymeric liquid of a conductive polymer, and at the same time, a polymerization initiator is mixed with the polymeric liquid.

The polymeric liquid of the conductive polymer is prepared, for example, by mixing a monomer and a solvent for polymerizing the conductive polymer.

The monomer that may be used includes, for example, aniline, pyrrole, and thiophene, or preferably aniline is used. These monomers can be used alone or in combination of two or more kinds.

The solvent that may be used includes, for example, water, and an acidic aqueous solution, or preferably the acidic aqueous solution is used. An acidic component that may be used to form the acidic aqueous solution includes, for example, an inorganic acid such as hydrochloric acid, nitric acid, sulfuric acid, or phosphoric acid, and an organic acid such as formic acid, acetic acid, or oxalic acid. These solvents can be used alone or in combination of two or more kinds.

The polymerization initiator that may be used includes: for example, an azo initiator such as 2,2'-azobisisobutyronitril, 2,2'-azobis(2-methylpropioneamidine) disulfate, or 2,2'-azobis(2-methylpropioneamidine) dihydrochloride; a persulfate initiator such as potassium persulfate (potassium peroxodisulfate) or ammonium persulfate (ammonium peroxodisulfate); a peroxide initiator such as benzoyl peroxide, t-butyl hydroperoxide, or hydrogen peroxide; a substituted ethane initiator such as phenyl substituted ethane; a carbonyl initiator such as an aromatic carbonyl compound; and a redox initiator such as a combination of persulfate and sodium hydrogensulfite or a combination of peroxide and sodium ascorbate. These polymerization initiators can be used alone or in combination of two or more kinds.

To mix the polymerization initiator with the polymeric liquid of the conductive polymer, a polymerization initiator solution obtained by dissolving a polymerization initiator in a solvent is prepared as required, and the polymerization initiator solution can also be mixed. As the solvent used for preparation of the polymerization initiator solution, the same solvent as that used for preparation of the polymeric liquid is used.

The concentration of monomers in the polymeric liquid of the conductive polymer is in the range of, for example, 0.005 to 0.5 mol/L, or preferably 0.01 to 0.1 mol/L. In a case where the solvent is an acidic aqueous solution, the concentration of acidic components is in the range of, for example, 0.002 to 0.1 mol/L, or preferably 0.005 to 0.05 mol/L. Further, when the polymerization initiator (or polymerization initiator solution) is mixed with the polymeric liquid, the concentration of the polymerization initiator in the polymeric liquid is in the range of, for example, 0.002 to 0.2 mol/L, or preferably 0.005 to 0.1 mol/L.

Then, the above-mentioned suspension board with circuit 1 is dipped in the polymeric liquid of the conductive polymer and mixed with the polymerization initiator. Thereafter, the suspension board with circuit 1 is dipped therein, for example, for 5 to 180 minutes, or preferably for 10 to 100 minutes. In such dipping, the dipping temperature of the polymeric liquid of the conductive polymer is set in the range of, for example, 1 to 40° C., or preferably 5 to 25° C.

Accordingly, the first semiconductive layer 5 made of the conductive polymer is formed by polymerization so as to be deposited on the surface of the insulating base layer 3 exposed from the conductive pattern 4.

Thereafter, the suspension board with circuit 1 in a production process formed with the first semiconductive layer 5 is washed with water.

Then, in this method, the conductive polymer of the first semiconductive layer 5 is doped as required.

To dope the conductive polymer of the first semiconductive layer 5, the suspension board with circuit 1 formed with the above-mentioned first semiconductive layer 5 is dipped in a solution in which a doping agent is dissolved (doping agent solution).

The doping agent imparts conductivity to the conductive polymer, and the doping agent that may be used includes, for example, p-toluenesulfonic acid, dodecylbenzenesulfonic acid, alkylnaphthalenesulfonic acid, polystyrenesulfonic acid, p-toluenesulfonic acid novolac resin, p-phenolsulfonic acid novolac resin, and β-naphthalenesulfonic acid-formalin condensate. These doping agents can be used alone or in combination of two or more kinds.

For example, water or methanol is used as a solvent for dissolving the doping agent.

In preparation of the doping agent solution, the solvent is mixed so that the concentration of the doping agent is in the range of, for example, 5 to 100% by weight, or preferably 10 to 50% by weight.

The dipping time of the suspension board with circuit 1 formed with the first semiconductive layer 5, in the doping agent solution is set in the range of, for example, 30 seconds to 30 minutes, or preferably 1 to 10 minutes. The dipping temperature of the doping agent solution is set in the range of, for example, 10 to 70° C., or preferably 20 to 60° C.

The doping of the above-mentioned first semiconductive layer 5 with the conductive polymer imparts conductivity to the conductive polymer.

Then, in this method, the suspension board with circuit 1 in a production process having the first semiconductive layer 5 doped with the conductive polymer is further washed with water.

The first semiconductive layer 5 made of the above-mentioned conductive polymer can be formed according to the description of Japanese Unexamined Patent Publication No. 5-331431, Japanese Unexamined Patent Publication No. 9-207259, Japanese Unexamined Patent Publication No. 2003-124581, Japanese Unexamined Patent Publication No. 2003-203436, Japanese Unexamined Patent Publication No. 2003-204130, Japanese Unexamined Patent Publication No. 2004-158480, or the like.

In the method of applying a solution of a conductive polymer to the suspension board with circuit 1 and then drying a solvent thereof, for example, the solution of the conductive polymer is first prepared.

To prepare the solution of the conductive polymer, for example, a polymerization initiator solution is mixed with a monomer solution to polymerize a monomer therein, thereby obtaining a conductive polymer. Subsequently, the conductive polymer thus obtained is dissolved in a solvent to prepare a solution of the conductive polymer.

The monomer solution is prepared by mixing a monomer and a solvent, for example. The same monomer as those described above is used as the monomer. The same solvent as that used to prepare the above-mentioned polymeric liquid of the conductive polymer is used as the solvent. The same polymerization initiator solution as described above is used.

The concentration of monomers in the monomer solution is in the range of, for example, 0.001 to 1 mol/L, or preferably 0.01 to 0.1 mol/L. In a case where the solvent is an acidic aqueous solution, the concentration of acidic components is in the range of, for example, 0.001 to 1 mol/L, or preferably 0.01 to 0.1 mol/L. When the polymerization initiator is mixed with the monomer solution, the concentration of the polymerization initiator is in the range of, for example, 0.001 to 1 mol/L, or preferably 0.01 to 0.1 mol/L.

The conductive polymer is obtained by the polymerization of the above-mentioned monomer, and for example, a powder of the conductive polymer can be obtained by filtering off the obtained powder and then thoroughly washing the powder.

The solvent for preparing a solution of the conductive polymer is not particularly limited as long as the conductive polymer can be dissolved therein. Examples of the solvent include an organic solvent, such as N-methyl-2-pyrrolidone (NMP), N,N-dimethylacetamide, N,N-dimethylformamide, dimethyl sulfoxide, 1,3-dimethyl-2-imidazolidinone, and sulfolane.

In the preparation of the solution of the conductive polymer, the solvent is mixed so that the concentration of the conductive polymer is in the range of, for example, 0.1 to 100 g/L.

Then, the prepared solution of the conductive polymer is applied to the suspension board with circuit 1 in a production process shown in FIG. 4(c) by a known application method, such as casting. Thereafter, the solvent therein is heated to dry at a temperature in the range of, for example, 50 to 200° C., or preferably 70 to 120° C., for example, for 1 to 60 minutes, or preferably for 1 to 10 minutes.

Accordingly, the first semiconductive layer 5 made of the conductive polymer is formed so as to be deposited on the surface of the insulating base layer 3 exposed from the conductive pattern 4.

Thereafter, the suspension board with circuit 1 in a production process formed with the first semiconductive layer 5 is washed with water.

Subsequently, in this method, the conductive polymer of the first semiconductive layer 5 is doped as required. The same method as described above is used to dope the conductive polymer of the first semiconductive layer 5. The doping of the above-mentioned first semiconductive layer 5 with the conductive polymer imparts conductivity to the conductive polymer.

Then, in this method, the suspension board with circuit 1 in a production process formed with the first semiconductive layer 5 doped with the conductive polymer is further washed with water.

The first semiconductive layer 5 made of the above-mentioned conductive polymer can be formed according to the description of Japanese Unexamined Patent Publication No. 2002-275261 or the like.

The semiconductive resin composition contains, for example an imide resin or an imide resin precursor, conductive particles, and a solvent.

A known imide resin can be used as the imide resin. Examples of the imide resin include polyimide, polyether imide, and polyamide imide.

The imide resin precursor that may be used includes, for example, the imide resin precursor described in Japanese Unexamined Patent Publication No. 2004-35825. Examples of the imide resin precursor include a polyamic acid resin.

The conductive particle that may be used includes, for example, conductive polymer particles, carbon particles, metal particles, and metal oxide particles.

The conductive polymer particles that may be used include particles of, such as polyaniline, polypyrrole, or polythiophene, or particles of a derivative thereof, or preferably polyaniline particles. The doping of the doping agent imparts conductivity to the conductive polymer particles.

The same doping agent as described above is used. The doping agent may be previously mixed with a solvent in which conductive polymer particles are dispersed (dissolved). Alternatively, after the first semiconductive layer 5 is formed, the suspension board with circuit 1 in a production process formed with the first semiconductive layer 5 may be dipped in a solution of the doping agent.

The carbon particles that may be used include, for example, carbon black particles, for example, a carbon nanofiber.

The metal particles that may be used include, for example, particles of, such as chromium, nickel, copper, titanium, zirconium, indium, aluminum, or zinc.

The metal oxide particles that may be used include, for example, particles of, such as chromium oxide, nickel oxide, copper oxide, titanium oxide, zirconium oxide, indium oxide, aluminum oxide, or zinc oxide, or particles of a composite oxide thereof. More specifically, particles such as a composite oxide of indium oxide and tin oxide (ITO particle), or a composite oxide of tin oxide and phosphorus oxide (PTO particles) are used as the metal oxide particle.

These conductive particles can be used alone or in combination of two or more kinds. Preferably, ITO particles are used.

The conductive particles have an average particle size in the range of, for example, 10 nm to 1 μm, or preferably 10 nm to 400 nm, or more preferably 10 nm to 100 nm. In the case where the conductive particles are a carbon nanofiber, the diameter thereof is in the range of 100 to 200 nm, and the length thereof is in the range of 5 to 20 μm, for example. When the average particle size (diameter) is smaller than those listed above, the adjustment of the average particle size (diameter) may be difficult. Conversely, when the average particle size (diameter) is larger than those listed above, the conductive particles may be unsuitable for coating.

The solvent that may be used is not particularly limited as long as an imide resin or an imide resin precursor, and conductive particles can be dispersed (dissolved) therein. Examples of the solvent include an aprotic polar solvent, such as N-methyl-2-pyrrolidone (NMP), N,N-dimethylacetamide, N,N-dimethylformamide, and dimethyl sulfoxide. These solvents can be used alone or in combination of two or more kinds.

The semiconductive resin composition can be prepared by mixing the imide resin or the imide resin precursor, the conductive particles, and the solvent, all described above.

The mixing ratio of the conductive particles is, for example, 1 to 300 parts by weight, or preferably 5 to 100 parts by weight, based on 100 parts by weight of the imide resin or the imide resin precursor. A lower mixing ratio of the conductive particles than this range may result in insufficient conductivity. Conversely, a higher mixing ratio of the conductive particles than this range may impair the good coating property of the imide resin or the imide resin precursor.

The solvent is mixed such that the total volume of the imide resin or the imide resin precursor, and the conductive particles is in the range of, for example, 1 to 40% by weight (solids concentration), or preferably 5 to 30% by weight (solids concentration) based on the semiconductive resin composition. Either a lower or a higher solids concentration than the above range may cause difficulties in controlling to the intended coating thickness.

The semiconductive resin composition thus prepared above is uniformly coated over all of the surface of the conductive pattern 4, the surface of the insulating base layer 3 exposed from the conductive pattern 4, and the surface of the metal supporting board 2 exposed from the insulating base layer 3, for example, by a known coating method, such as roll coating method, gravure coating method, spin coating method, or bar coating method. Thereafter, the coated semiconductive resin composition is heated to dry at a temperature in the range of, for example, 60 to 250° C., or preferably 80 to 200° C., for example, for 1 to 30 minutes, or preferably for 3 to 15 minutes.

In the case where the semiconductive resin composition contains an imide resin precursor, the semiconductive resin composition is dried, and thereafter, heated at 250° C. or higher under reduced pressure, to be cured (imidized).

Then, the first semiconductive layer 5 is formed in the above-mentioned pattern by removing the first semiconductive layer 5 formed on the surface of the conductive pattern 4 and the surface of the metal supporting board 2 by etching or the like.

The first semiconductive layer 5 can be formed from a metal, for example, by a method of sputtering a metal as a target, then to oxide by heating, as required, a method of reactive sputtering, or a method of sputtering a metal oxide as a target. In the case where a conductive polymer is formed from a metal by the above-mentioned method, after sputtering or oxidation by heating, the first semiconductive layer 5 thus formed on the surface of the conductive pattern 4 is removed by etching or the like so as to be formed on the surface of the insulating base layer 3 exposed from the conductive pattern 4.

Thus, the first semiconductive layer 5 can be formed on the surface of the insulating base layer 3 exposed from the conductive pattern 4 so as to be in contact with and electrically connected to the conductive pattern 4 and the metal supporting board 2.

The first semiconductive layer 5 thus formed has a thickness in the range of, for example, 5 to 50 nm, or preferably 10 to 40 nm.

The surface resistance value of the first semiconductive layer 5 is set in the range of, for example, $10^4$ to $10^{12}$ Ω/□, or preferably $10^5$ to $10^{11}$Ω/□. When the surface resistance value of the first semiconductive layer 5 is smaller than this range, malfunction of the electronic component mounted thereon may arise. Conversely, when the surface resistance value of the first semiconductive layer 5 is larger than this range, an electrostatic breakdown may not be prevented.

Then, in this method, as shown in FIG. 5(*e*), the insulating cover layer 6 is formed on the metal supporting board 2, conductive pattern 4, and the first semiconductive layer 5 in the above-mentioned pattern.

As an insulator for forming the insulating cover layer 6, the same insulator as that used for the insulating base layer 3 is used. Preferably a photosensitive synthetic resin, or more preferably, a photosensitive polyimide is used.

To form the insulating cover layer 6 on the metal supporting board 2, the conductive pattern 4, and the first semiconductive layer 5 in the above-mentioned pattern, for example, a varnish of photosensitive polyamic acid resin is first uniformly coated over the surfaces of the metal supporting board 2, the conductive pattern 4, and the first semiconductive layer 5 in the same method as above. Subsequently, the coated varnish is dried as in the same manner as above to form a cover coating.

Thereafter, in the same method as above, the cover coating is exposed to light via a photomask and is then heated at a given temperature as required. Thereafter, in the same method as above, a portion where the insulating cover layer 6 is not formed is removed by development. Then, for example, the cover coating is heated at 250° C. or higher under reduced pressure to be cured (imidized). Thus, the insulating cover layer 6 is formed.

Accordingly, the insulating cover layer 6 can be formed on the metal supporting board 2, the conductive pattern 4, and the first semiconductive layer 5 in the above-mentioned pattern.

The insulating cover layer 6 thus formed has a thickness in the range of, for example, 1 to 40 μm, or preferably 3 to 5 μm.

Then, in this method, as shown in FIG. 5(*f*), the first semiconductive layer 5 exposed from the insulating cover layer 6 is removed by etching. For example, as an etchant, an alkaline aqueous solution such as a potassium hydroxide aqueous solution is used, and wet etching is performed by a dipping method or spraying method, using the insulating cover layer 6 as an etching resist.

Therefore, the first semiconductive layer 5 can be formed so that the widthwise one end portion 18 and the lengthwise one end portion 20 (cf. FIG. 3) are in the same position as the widthwise one end portion 15 and the lengthwise one end portion 26 of the insulating cover layer 6, respectively, in plane view.

Subsequently, in this method, as shown in FIG. 5(*g*), the second semiconductive layer 7 is formed in the above-mentioned pattern on the surface of the insulating cover layer 6 so as to be in contact with and electrically connected to the metal supporting board 2.

As a semiconductive material for forming the second semiconductive layer 7, the same semiconductive material as that used for the above-mentioned first semiconductive layer 5 is used, or preferably a conductive polymer, or more preferably polyaniline is used. The same method as for the formation of the first semiconductive layer 5 is used to form the second semiconductive layer 7 from the conductive polymer.

Thus, the second semiconductive layer 7 can be formed on the surface of the insulating cover layer 6 in the above-mentioned pattern so as to be in contact with and electrically connected to the metal supporting board 2.

The second semiconductive layer 7 thus formed has a thickness in the range of, for example, 5 to 50 nm, or preferably 10 to 40 nm.

The surface resistance value of the second semiconductive layer 7 is set in a range of, for example, $10^4$ to $10^{12}$ Ω/□, or preferably $10^5$ to $10^{11}$Ω/□. When the surface resistance value of the second semiconductive layer 7 is smaller than this range, malfunction of the electronic component mounted thereon may arise. Conversely, when the surface resistance value of the second semiconductive layer 7 is larger than this range, an electrostatic breakdown may not be prevented.

Thereafter, in this method, a metal plating layer, which is not shown, is formed on the upper surface of the terminal portion 8 as required. As shown in FIG. 1, the metal supporting board 2 is cut out by chemical etching to form the gimbal 10, and also trimmed to obtain the suspension board with circuit 1.

The suspension board with circuit 1 includes the first semiconductive layer 5 formed on the surface of the insulating base layer 3 and the second semiconductive layer 7 formed on the surface of the insulating cover layer 6, in which the first semiconductive layer 5 is in contact with and electrically connected to the conductive pattern 4 and the metal supporting board 2, and the second semiconductive layer 7 is in contact with and electrically connected to the metal supporting board 2. Therefore, the first semiconductive layer 5 and the second semiconductive layer 7 allow movement (grounding) of static electricity charged on the conductive pattern 4, the insulating base layer 3, and the insulating cover layer 6 to the metal supporting board 2, thereby allowing to efficiently remove the static electricity charged thereon. Thus, electrostatic breakdown of the electronic components mounted thereon can be reliably prevented.

In the suspension board with circuit 1, the conductive pattern 4 includes the terminal portion 8 exposed by opening the insulating cover layer 6, and in the second semiconductive layer 7, the seventh lower end portion 32 is in contact with and electrically connected to the terminal portion 8, and the third lower end portion 28, the fourth lower end portion 29, the fifth lower end portion 30, and the sixth lower end portion 31 are in contact with and electrically connected to the metal supporting board 2. Therefore, the static electricity charged on the terminal portion 8 can be moved (grounded) to the metal supporting board 2 via the second semiconductive layer 7, thereby allowing to efficiently remove the static electricity. Thus, electrostatic breakdown of the electronic components mounted thereon can be reliably prevented.

In the suspension board with circuit 1, the first semiconductive layer 5 and the second semiconductive layer 7 are in contact with each other. That is, the first continuous portion 33 of the second semiconductive layer 7 is in contact with the widthwise one end portion 18 of the first semiconductive layer 5 on widthwise one side, and the second continuous portion 34 of the second semiconductive layer 7 is in contact with the lengthwise one end portion 20 of the first semiconductive layer 5 on lengthwise one side. Therefore, these contacts improve the efficiency of movement (grounding) of the static electricity, thereby allowing to further efficiently remove the static electricity.

In the above explanation, the first semiconductive layer 5 and the second semiconductive layer 7 can be formed from semiconductive materials of different kinds. For example, the first semiconductive layer 5 can be formed from a metal and the second semiconductive layer 7 can be formed from a conductive polymer. Alternatively, vice versa, that is, the first semiconductive layer 5 can be formed from a conductive polymer, and the second semiconductive layer 7 can be formed from a metal. Further, the first semiconductive layer 5 and the second semiconductive layer 7 can be formed from a semiconductive material of the same kind. That is, both the first semiconductive layer 5 and the second semiconductive layer 7 can be formed from a conductive polymer or a metal. Preferably, both the first semiconductive layer 5 and the second semiconductive layer 7 are formed from a conductive polymer, or more preferably from polyaniline.

More specifically, in the case where the first semiconductive layer 5 and the second semiconductive layer 7 are formed from a conductive polymer, the first semiconductive layer 5 can be reliably formed on the surface of the insulating base layer 3 because of high adhesion between the conductive polymer of the first semiconductive layer 5 and the insulating base layer 3 (resin). In addition, the second semiconductive layer 7 can be reliably formed on the surface of the insulating cover layer 6 because of high adhesion between the conductive polymer of the second semiconductive layer 7 and the insulating cover layer 6 (resin).

Further, in the case where both the first semiconductive layer 5 and the second semiconductive layer 7 are formed from a conductive polymer, any sputtering apparatus or the like is not required for such formation, so that the first semiconductive layer 5 and the second semiconductive layer 7 can be formed easily. Thus, the steps of producing the suspension board with circuit 1 can be simplified.

In the above explanation, the first semiconductive layer 5 is formed so as to be in contact with the metal supporting board 2. However, for example, the first semiconductive layer 5 can be formed so as to be electrically connected to the metal supporting board 2 without direct contact therewith.

More specifically, though not shown, the first semiconductive layer 5 is electrically connected to the metal supporting board 2 via the second semiconductive layer 7 (the first continuous portion 33) without being formed on the lateral side surface of the widthwise other end portion 14 of the insulating base layer 3 in the widthwise direction. Further, the first semiconductive layer 5 is electrically connected to the metal supporting board 2 via the second semiconductive layer 7 (the second continuous portion 34) without being formed on the lateral side surface of the lengthwise other end portion 25 of the insulating base layer 3 in the lengthwise direction.

In the above explanation, the second semiconductive layer 7 is formed so as to be in contact with the metal supporting board 2. However, for example, the second semiconductive layer 7 can be formed so as to be electrically connected to the metal supporting board 2 without direct contact therewith.

More specifically, though not shown, the second semiconductive layer 7 is electrically connected to the metal supporting board 2 via the first semiconductive layer 5 (the widthwise one end portion 18 of the first semiconductive layer 5) without being formed on the lateral side surface of the widthwise one end portion 13 of the insulating base layer 3 and the lateral side surface of the widthwise other end portion 16 of the insulating cover layer 6 in the widthwise direction. Further, the second semiconductive layer 7 is electrically connected to the metal supporting board 2 via the first semiconductive layer 5 (the lengthwise one end portion 20 of the first semiconductive layer 5) without being formed on the lateral side surface of the lengthwise one end portion 24 of the insulating base layer 3 and the lateral side surface of the lengthwise other end portion 27 of the insulating cover layer 6 in the lengthwise direction.

EXAMPLE

While in the following, the present invention is described in further detail with reference to Examples, the present invention is not limited to any of them by no means.

Example 1

A metal supporting board of a stainless foil of 20 µm thick was prepared (cf. FIG. 4(a)).

Subsequently, a varnish of photosensitive polyamic acid resin was uniformly coated over a surface of the metal supporting board using a spin coater. The coated varnish was then heated at 90° C. for 15 minutes to form a base coating. Thereafter, the base coating was exposed to light at 700 mJ/cm$^2$ via a photomask, and then heated at 190° C. for 10 minutes. The base coating thus heated was then developed using an alkaline developer. Subsequently, the coating was cured at 385° C. under the pressure reduced to 1.33 Pa, thereby forming an insulating base layer of polyimide on the metal supporting board in a pattern corresponding to a portion where a conductive pattern was formed (cf. FIG. 4(b)). The insulating base layer thus formed had a thickness of 10 µm.

Next, by an additive method, a conductive pattern made of a 10 μm thick copper foil was formed on an upper surface of the insulating base layer as a wired circuit pattern integrally including a terminal portion and a wire (cf. FIG. 4(c)).

Next, a first semiconductive layer was formed on a surface of the insulating base layer exposed from the conductive pattern so as to be in contact with and electrically connected to the conductive pattern and the metal supporting board.

To form the first semiconductive layer, a polyaniline powder was first prepared.

To prepare the polyaniline powder, 6000 g of distilled water, 360 mL of 36% hydrochloric acid, and 400 g (4.295 mol) of aniline were mixed in a 10-liter separable flask equipped with an stirrer, a thermometer, and a straight tube adapter, and the mixture was then stirred therein to prepare a monomer solution of aniline. To the monomer solution of aniline, 1927 g (sulfuric acid: 4.295 mol) of 28% sulfuric acid aqueous solution was mixed with cooling. Then, 3273 g (ammonium peroxodisulfate: 4.295 mol) of 30% polymerization initiator solution was gradually added dropwise under stirring with cooling so that the monomer solution of aniline was kept at a temperature of −3° C. or lower. Thereafter, the added solution was stirred for another 1 hour so that the reaction solution was kept at a temperature of −3° C. or lower. Thus, a polyaniline powder was deposited.

Thereafter, the polyaniline powder was filtered off, and the resulting powder was washed with water and washed with acetone. The polyaniline powder was supplied in 4 L of 2N aqueous ammonia, and then stirred at a rotation speed of 5000 rpm for 5 hours using an autohomomixer. Thereafter, the polyaniline powder was filtered off and further thoroughly washed with water and with acetone further to prepare a polyaniline powder.

Next, 10 g of the prepared polyaniline powder was dissolved in 90 g of NMP to prepare an NMP solution of polyaniline.

Next, the NMP solution of polyaniline was applied to the suspension board with circuit described above by casting.

Thereafter, the casted NMP solution was dried at 80° C. for 10 minutes to form a first semiconductive layer made of polyaniline. Then, the suspension board with circuit formed with the first semiconductive layer was dipped in an aqueous solution containing 20% by weight of p-phenolsulfonic acid novolac resin at 80° C. for 10 minutes to dope the first semiconductive layer. Subsequently, the first semiconductive layer thus doped was washed with water (cf. FIG. 4(d)). The doped first semiconductive layer made of polyaniline had a thickness of 30 nm. When the surface resistance value of the doped first semiconductive layer made of polyaniline was measured at a temperature of 25° C. and a humidity of 15% using a surface resistance measuring device (Hiresta-up MCP-HT450 available from Mitsubishi Chemical Corporation), the value was $1\times10^7$ Ω/□.

Next, the varnish of the photosensitive polyamic acid resin described above was uniformly coated over all of the surface of the metal supporting board, the surface of the conductive pattern, and the surface of the first semiconductive layer using a spin coater, and then heated at 90° C. for 10 minutes to form a cover coating having a thickness of 7 μm. Thereafter, the cover coating was exposed to light at 700 mJ/cm$^2$ via a photomask, and then heated at 180° C. for 10 minutes. The cover coating was then developed using an alkaline developer to pattern the cover coating. Subsequently, the cover coating was cured at 385° C. under the pressure reduced to 1.33 Pa. As a result of this, an insulating cover layer of polyimide was formed on the metal supporting board, the conductive pattern, and the first semiconductive layer in the above-mentioned pattern (cf. FIG. 5(e)). The insulating cover layer had a thickness of 5 μm.

Next, the first semiconductive layer exposed from the insulating cover layer was removed by wet etching using the insulating cover layer as an etching resist and using an aqueous potassium hydroxide solution (cf. FIG. 5(f)).

Next, a second semiconductive layer was formed on a surface of the insulating cover layer so as to be in contact with and electrically connected to the metal supporting board.

To form the second semiconductive layer, the same NMP solution of polyaniline as that used for formation of the first semiconductive layer was prepared, and the NMP solution was applied to the suspension board with circuit by casting. Thereafter, the casted NMP solution was dried, and thereafter, doped and washed with water, as in the same manner as above. Thus, the second semiconductive layer was formed and doped (cf. FIG. 5(g)). The doped second semiconductive layer made of polyaniline had a thickness of 35 nm. When the surface resistance value of the doped second semiconductive layer made of polyaniline was measured at a temperature of 25° C. and a humidity of 15% using a surface resistance measuring device (Hiresta-up MCP-HT450 available from Mitsubishi Chemical Corporation), the value was $1\times10^6$ Ω/□.

Thereafter, a metal plating layer was formed on the surface of the terminal portion. Then, the metal plating layer was cut out by chemical etching to form a gimbal, and also trimmed to obtain the suspension board with circuit (cf. FIG. 1).

(Evaluation)

Charge Attenuation Property

Charge attenuation property of the suspension board with circuit obtained in Example 1 was evaluated using a nanocoulomb meter (commercially available from Kasuga Electric Works, Ltd.). The results showed that a charge of 0.1 nC (nanocoulomb) on the insulating cover layer attenuated for an attenuation time of 0.10 second and the standard deviation was 0.01, and a charge of 0.1 nC (nanocoulomb) on the insulating base layer attenuated for an attenuation time of 2.00 seconds and the standard deviation was 0.50.

The result confirmed that the suspension board with circuit in Example 1 was able to efficiently remove static electricity.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
a metal supporting board;
an insulating base layer formed on the metal supporting board;
a conductive pattern formed on the insulating base layer;
a first semiconductive layer formed on a surface of the insulating base layer exposed from the conductive pattern;
an insulating cover layer formed on the conductive pattern and the first semiconductive layer; and
a second semiconductive layer formed on a surface of the insulating cover layer,
wherein the first semiconductive layer is electrically connected to the conductive pattern and the metal supporting board,
the second semiconductive layer is electrically connected to the metal supporting board, the first semiconductive layer is formed to be interposed between the insulating base layer and the insulating cover layer, wherein the conductive pattern comprises a terminal portion exposed by opening the insulating cover layer, and at least one end of the second semiconductive layer is electrically connected to the terminal portion, and at least the other end of the second semiconductive layer is electrically connected to the metal supporting board, wherein the other end of the second semiconductive layer comprises at least one lower end portion having a lower side in a thickness direction which is in contact with and electrically connected to an upper surface of a widthwise end portion of the metal supporting board, and wherein the first semiconductive layer and the second semiconductive layer are in contact with each other.

2. The wired circuit board according to claim 1, wherein both the first semiconductive layer and the second semiconductive layer are made of a conductive polymer.

3. The wired circuit board according to claim 1, wherein the first semiconductive layer has a surface resistance value of $10^4$ to $10^{12} \Omega/\square$.

4. The wired circuit board according to claim 1, wherein the second semiconductive layer has a surface resistance value of $10^4$ to $10^{12} \Omega/\square$.

5. A method for producing a wired circuit board, comprising the steps of:

preparing a metal supporting board and forming an insulating base layer formed on the metal supporting board and a conductive pattern formed on the insulating base layer;

forming a first semiconductive layer on a surface of the insulating base layer exposed from the conductive pattern so as to be electrically connected to the conductive pattern and the metal supporting board;

forming an insulating cover layer on the conductive pattern and the first semiconductive layer; and forming a second semiconductive layer on a surface of the insulating cover layer so as to be electrically connected to the metal supporting board, wherein the conductive pattern comprises a terminal portion exposed by opening the insulating cover layer, and at least one end of the second semiconductive layer is electrically connected to the terminal portion, and at least the other end of the second semiconductive layer is electrically connected to the metal supporting board, wherein the other end of the second semiconductive layer comprises at least one lower end portion having a lower side in a thickness direction which is in contact with and electrically connected to an upper surface of a widthwise end portion of the metal supporting board, and wherein the first semiconductive layer and the second semiconductive layer are in contact with each other.

6. The method for producing a wired circuit board according to claim 5, wherein the first semiconductive layer is formed from a conductive polymer in the step of forming the first semiconductive layer, and the second semiconductive layer is formed from a conductive polymer in the step of forming the second semiconductive layer.

7. The method for producing a wired circuit board according to claim 5, wherein the insulating cover layer is formed so that the first semiconductive layer is interposed between the insulating cover layer and the insulating base layer in the step of forming the insulating cover layer.

8. The method for producing a wired circuit board according to claim 5, further comprising:

forming the insulating cover layer to expose a part of the first semiconductive layer, and removing by etching the first semiconductive layer exposed from the insulating cover layer.

* * * * *